United States Patent
Ito et al.

(10) Patent No.: US 10,164,610 B2
(45) Date of Patent: Dec. 25, 2018

(54) SIGNAL OUTPUT DEVICE

(71) Applicant: DENSO CORPORATION, Kariya, Aichi-pref. (JP)

(72) Inventors: Takasuke Ito, Kariya (JP); Shigeki Otsuka, Kariya (JP); Kazuyoshi Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/775,850

(22) PCT Filed: Nov. 11, 2016

(86) PCT No.: PCT/JP2016/083521
§ 371 (c)(1),
(2) Date: May 14, 2018

(87) PCT Pub. No.: WO2017/122419
PCT Pub. Date: Jul. 20, 2017

(65) Prior Publication Data
US 2018/0331674 A1   Nov. 15, 2018

(30) Foreign Application Priority Data

Jan. 14, 2016 (JP) ................................ 2016-005237

(51) Int. Cl.
*H03H 17/02* (2006.01)
*H04B 3/20* (2006.01)

(52) U.S. Cl.
CPC ...... *H03H 17/028* (2013.01); *H03H 17/0248* (2013.01); *H04B 3/20* (2013.01)

(58) Field of Classification Search
CPC .................. H03H 17/028; H03H 17/0248
USPC ................ 327/113, 311, 531, 532, 551–559
See application file for complete search history.

(56) References Cited

U.S. PATENT DOCUMENTS

| | | | |
|---|---|---|---|
| 5,121,009 A * | 6/1992 | Braathen | H03H 11/1217 327/552 |
| 7,920,979 B2 * | 4/2011 | Kamenick | H04B 3/00 702/66 |
| 2006/0164159 A1 * | 7/2006 | Kimura | H03H 11/04 327/552 |

* cited by examiner

*Primary Examiner* — Thomas Skibinski
(74) *Attorney, Agent, or Firm* — Posz Law Group, PLC

(57) ABSTRACT

A signal output device is provided in a communication apparatus. The communication apparatus communicates with a different one of the communication apparatus using a single line. The signal output device includes a signal output unit. The signal output unit includes a first filter and a second filter. The first filter is provided by a Bessel filter. The second filter is provided by a Chebyshev filter or a Butterworth filter. The signal output unit outputs a signal which is obtained by passing a predetermined signal through the first filter and the second filter. The signal output from the signal output unit has a pass characteristic of the first filter and a pass characteristic of the second filter. A cutoff frequency of the first filter is set to be lower than a cutoff frequency of the second filter.

4 Claims, 16 Drawing Sheets

SIGNAL OUTPUT DEVICE

CROSS REFERENCE TO RELATED APPLICATIONS

This application is a U.S. national stage application of International Application No. PCT/JP2016/083521 filed on Nov. 11, 2016 and is based on Japanese Patent Application No. 2016-005237 filed on Jan. 14, 2016, the disclosures of which are incorporated herein by reference.

TECHNICAL FIELD

The present disclosure relates to a signal output device that reduces a noise radiating from a transmission line, and shapes a waveform of a signal.

BACKGROUND

Multiple in-vehicle apparatuses are attached to a vehicle, and two of the multiple in-vehicle apparatuses may communicate with one another by transmitting a signal through a transmission line. The communication signal includes a harmonic, so a harmonic noise radiates from the transmission line.

In order to suppress the harmonic noise, various types of radiation noise reduction techniques have been developed (see, e.g., Patent Literature 1). The invention disclosed in Patent Literature 1 limits a frequency band of a rectangular signal so as to reduce the radiation noise.

PRIOR ART LITERATURE

Patent Literature

Patent Literature 1: U.S. Pat. No. 7,920,979

SUMMARY

With the technique disclosed in Patent Literature 1, ringing occurs in a waveform in which a frequency band is limited. Thus, it is concerned that the fluctuation amount caused by the ringing may exceed a noise margin. When a standard that does not permit the occurrence of the ringing or a standard that has strict restriction on the ringing is adopted, the technique disclosed in Patent Literature 1 has difficulty in satisfying the standard. In order to solve the difficulty, a signal output device that outputs the waveform is required to limit a signal to have an intended frequency band with suppressed ringing.

In view of the foregoing difficulties, it is an object of the present disclosure to provide a signal output device that limits a signal to have an intended frequency band with suppressed ringing.

According to an aspect of the present disclosure, a signal output device includes a signal output unit. The signal output unit includes a first filter and a second filter. The first filter is provided by a Bessel filter. The second filter is provided by a Chebyshev filter or a Butterworth filter. The signal output unit outputs a signal which is obtained by passing a predetermined signal through the first filter and the second filter. The signal output from the signal output unit has a pass characteristic of the first filter and a pass characteristic of the second filter. Even when a rectangular signal is input, the signal output device can process an edge of the rectangular signal to be blunt. A cutoff frequency of the first filter is set to be lower than a cutoff frequency of the second filter. This configuration can limit the signal to have an intended frequency with a suppressed ringing.

BRIEF DESCRIPTION OF DRAWINGS

The above and other objects, features and advantages of the present invention will become more apparent from the following detailed description made with reference to the accompanying drawings. In the drawings.

EMBODIMENTS

Figure 1:
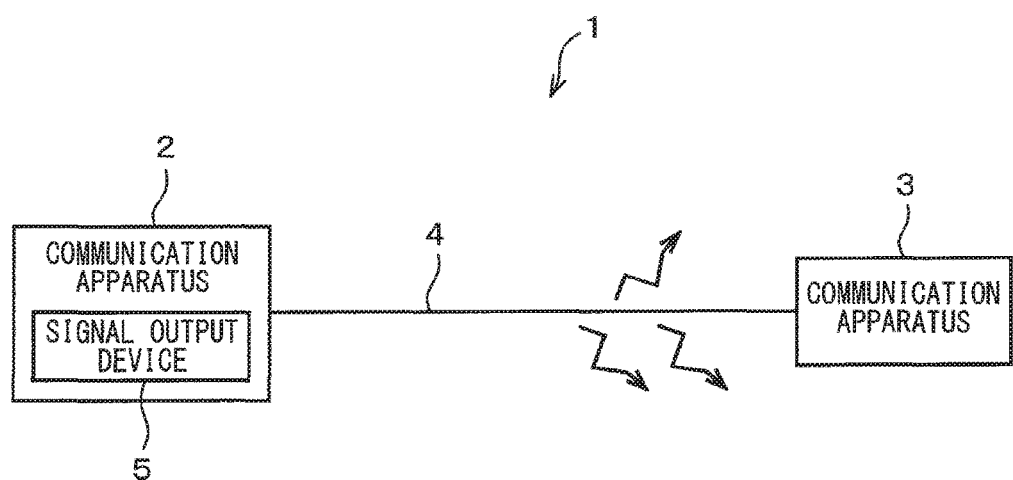
FIG. 1 is a diagram schematically showing a communication system according to a first embodiment of the present disclosure.

Hereinafter, embodiments of a signal output device will be described with reference to the drawings. In the respective embodiments below, same or equivalent portions are indicated by same reference symbols in the drawings and a same description applies to a portion indicated by the same reference symbol.

(First Embodiment)

FIG. 1 to FIG. 15 are schematic diagrams according to a first embodiment of the present disclosure. FIG. 1 schematically shows a configuration of a communication system 1 in a vehicle. In the communication system 1, a communication apparatus 2 is connected to a communication apparatus 3 through a single line 4 that functions as a transmission line. The communication apparatus 2 is provided as a master and the communication apparatus 3 is provided as a slave. The communication apparatus 2 and the communication apparatus 3 execute transmission and reception of information through the single line 4.

The communication apparatus 2 includes a signal output device 5 that shapes a waveform of a rectangular signal and outputs the signal. A communication signal corresponding to the signal output from the signal output device 5 is transmitted to an in-vehicle network, which is not shown in figures, through the single line 4. The single line 4 generates a harmonic of the communication signal. It is concerned that the single line 4 radiates various types of noises generated from the harmonic of the communication signal and a fundamental wave of carrier wave of the communication signal.

Figure 2:
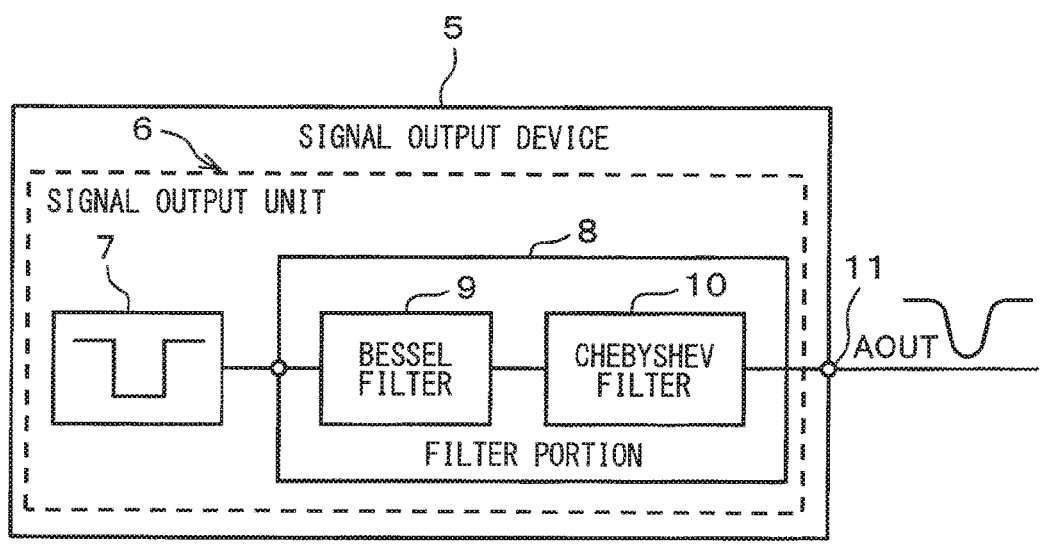
FIG. 2 is a block diagram schematically showing an electrical configuration of a signal output device.

FIG. 2 shows a configuration of the signal output device 5 according to the present embodiment. As shown in FIG. 2, the signal output device 5 includes a signal output unit 6. The signal output unit 6 includes a signal generator 7 and a filter portion 8. The signal generator 7 generates a rectangular signal, which is the communication signal. The filter portion 8 includes a Bessel filter 9 and a Chebyshev filter 10. The Bessel filter 9 functions as a first filter and the Chebyshev filter 10 functions as a second filter. The Bessel filter 9 may be provided by a tenth-order Bessel low-pass filter, and is capable of maximizing a flatness of a group delay. The Bessel filter 9 may set a predetermined frequency equal to or lower than 150 [kHz] as a cutoff frequency. The Bessel filter 9 passes the rectangular signal generated by the signal generator 7 with a frequency lower than the cutoff frequency fa, and outputs the signal to the Chebyshev filter 10.

The Chebyshev filter 10 may be provided by a fourth-order Chebyshev low-pass filter, and is capable of improving a cutoff characteristic. The Chebyshev filter 10 may also set a predetermined frequency equal to or lower than 150 [kHz] as a cutoff frequency fb. The Chebyshev filter 10 passes the rectangular signal generated by the Bessel filter 9 with a frequency lower than the cutoff frequency fb, and outputs an analog signal AOUT from an output terminal 11. As shown in FIG. 2, in the present embodiment, the Bessel filter 9 is provided in a preceding stage and the Chebyshev filter 10 is provided in a following stage. Alternatively, the Bessel filter 9 and the Chebyshev filter 10 may be provided in reverse. That is, the Chebyshev filter 10 is provided in the preceding stage, and the Bessel filter 9 is provided in the following stage. The filter portion 8 is capable of processing the rectangular signal to be blunt using a combination of the characteristics of the Bessel filter 9 and the Chebyshev filter 10. With this configuration, the filter portion 8 is capable of reducing a waveform distortion and suppressing the harmonic. Hereinafter, detail of standards and results of experiments will be described.

Figure 3:
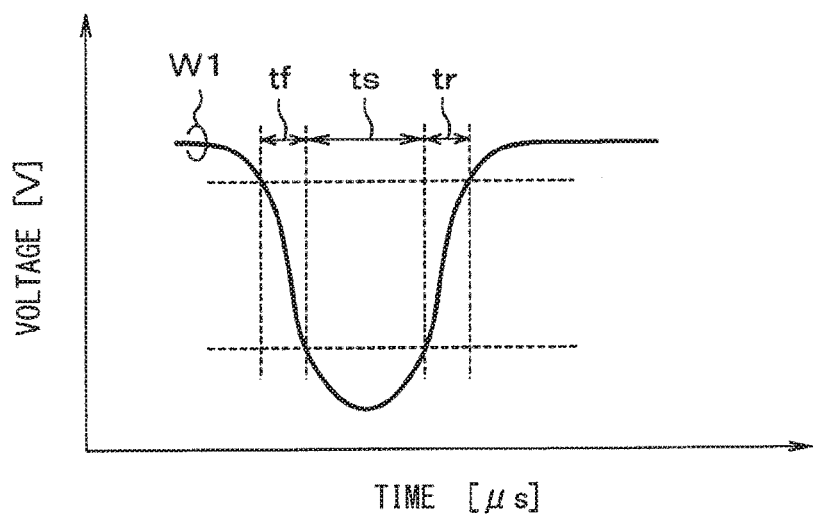
FIG. 3 is a diagram showing a standard of a falling pulse.

FIG. 3 shows a standard of a falling pulse in SENT (Single-Edge Nibble Transmission). FIG. 3 schematically shows a signal waveform W1 output based on a single falling pulse. SENT is defined as one-way and single line communication protocol under Single-Edge Nibble Transmission for Automotive Applications in SAEJ2716. The protocol is employed in a point-to-point transmission process for a signal value, and is capable of forwarding data with high resolution.

As shown in FIG. 3, assume that the falling pulse is generated. In this case, SENT standard defines a fall time tf of the signal waveform W1 as shorter than 6.5 [μs], and defines a rise time tr as equal to or shorter than 18 [μs]. The standard also defines a signal stable time is as equal to or longer than 6 [μs].

Figure 4:
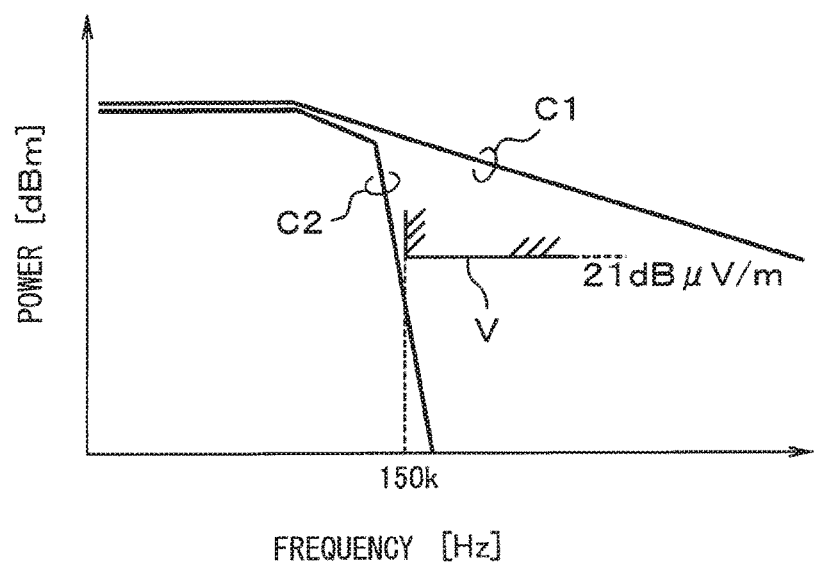
FIG. 4 is a diagram showing a standard of a limit value of a radiation interfering wave.

A vehicle has a receiver for receiving AM radio, FM radio, or the like. A standard, CISPR 25 (1995) "Limits and methods of measurement of radio disturbance characteristics for the protection of receivers used on board vehicles" defines a recommendation limit value of interfering wave or the like for protecting the in-vehicle receiver. FIG. 4 shows a range of a standard value V. The standard defines a measurement of radiation interfering wave in a frequency band of equal to or higher than 150 [kHz]. A frequency characteristic C1 of a waveform of a typical rectangular signal is shown in FIG. 4. As shown in FIG. 4, the standard requires an electric field intensity of the signal to be less than 21 [dBpV/m] in a frequency range equal to or higher than 150 [kHz] within a LW frequency band.

Figure 5:
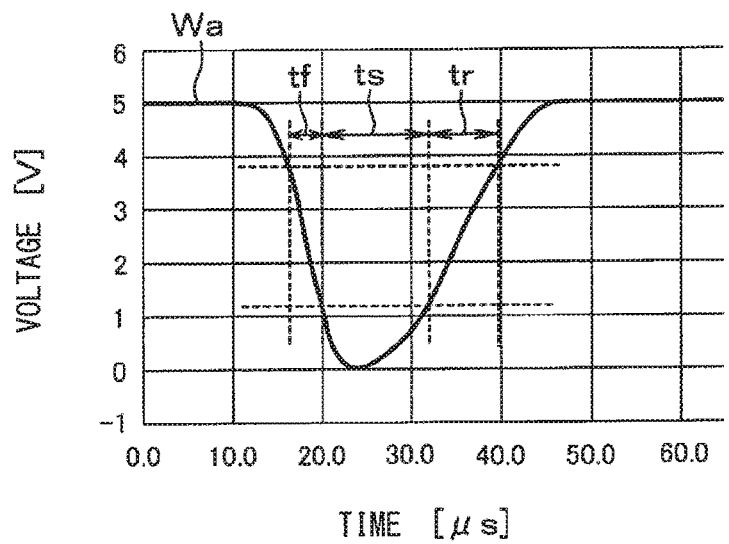
FIG. 5 is a diagram showing an example of an output waveform corresponding to an input of the falling pulse.
Figure 6:
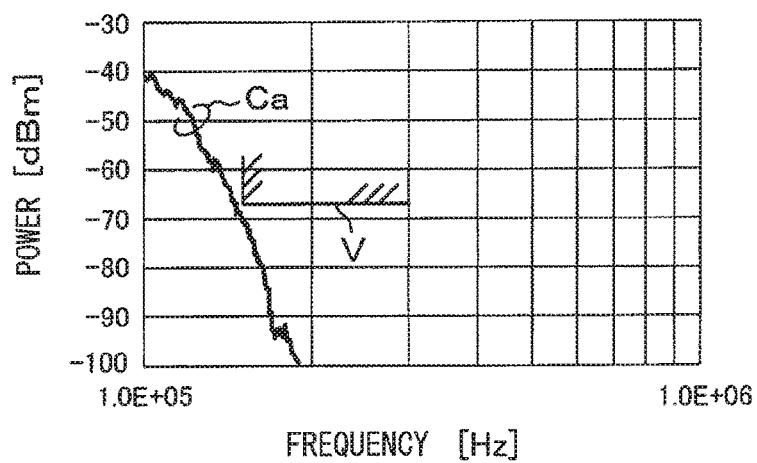
FIG. 6 is a diagram schematically showing a simulation result of the radiation interfering wave.

FIG. 5 corresponds to FIG. 3, and schematically shows a signal waveform when the configuration of the present embodiment is employed. FIG. 6 corresponds to FIG. 4, and schematically shows an output characteristic based on a frequency change when the configuration of the present embodiment is employed. FIG. 5 shows a signal waveform Wa, and the configuration of the present embodiment satisfies the standard in SENT. FIG. 6 shows a pass characteristic and a cutoff characteristic Ca, and the configuration of the present embodiment satisfies the standard value V of CISPR 25 in the frequency band of equal to or higher than 150 [kHz].

When the filter portion 8 is employed, a relation of a cutoff frequency fa of the Bessel filter 9 and a cutoff frequency fb of the Chebyshev filter 10 will be described. The Chebyshev filter 10 has a better cutoff characteristic than the Bessel filter 9. Thus, the cutoff frequency fa of the Bessel filter 9 is set to be equal to or lower than the cutoff frequency fb of the Chebyshev filter 10. With this configuration, the filter portion 8 is capable of enhancing the cutoff characteristic by the cutoff frequency fb of the Chebyshev filter 10.

Figure 7:
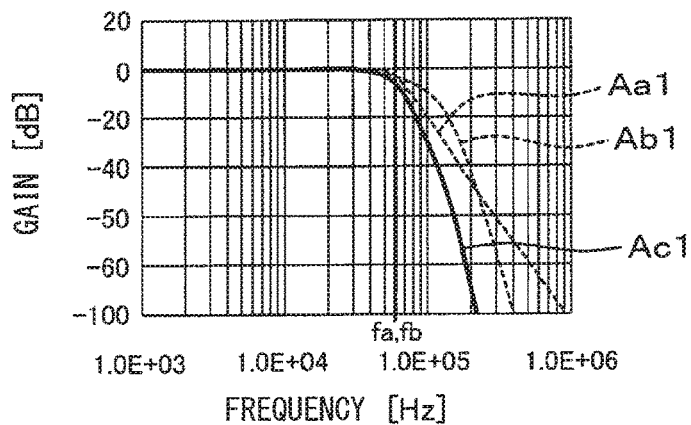
FIG. 7 is a diagram schematically showing a frequency characteristic of gain of each filter when a ratio of a cutoff frequency of a first filter to a cutoff frequency of a second filter is 1:1.
Figure 8:
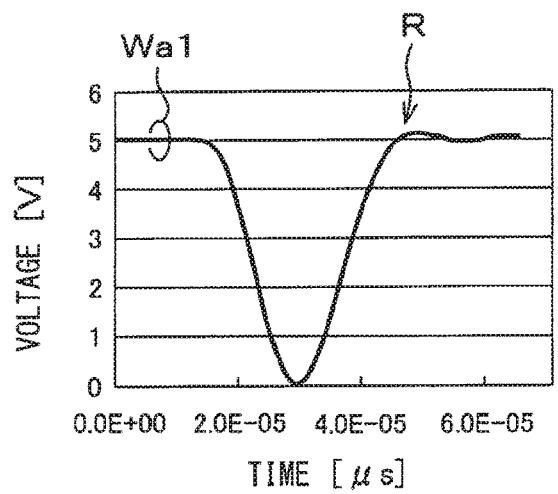
FIG. 8 is a diagram showing an example of an output waveform corresponding to the input of the falling pulse when the ratio of the cutoff frequency of the first filter to the cutoff frequency of the second filter is 1:1.
Figure 9:
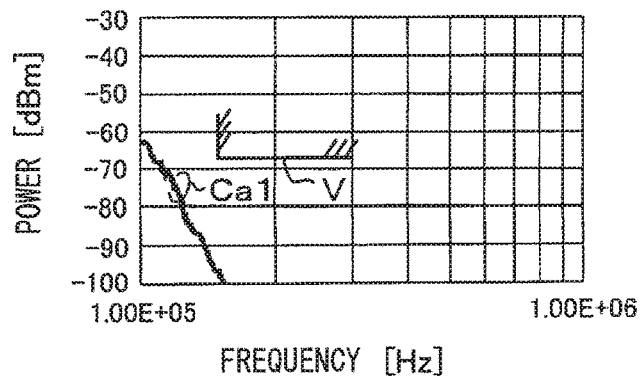
FIG. 9 is a diagram schematically showing a simulation result of a pass characteristic and a simulation result of a cutoff characteristic when the ratio of the cutoff frequency of the first filter to the cutoff frequency of the second filter is 1:1.
Figure 10:
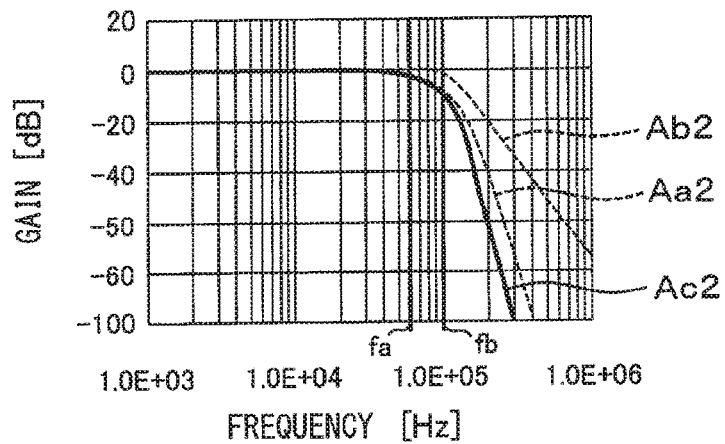
FIG. 10 is a diagram schematically showing a frequency characteristic of gain of each filter when a ratio of the cutoff frequency of the first filter to the cutoff frequency of the second filter is 1:x (x is greater than 1 and equal to or less than 2.5)
Figure 11:
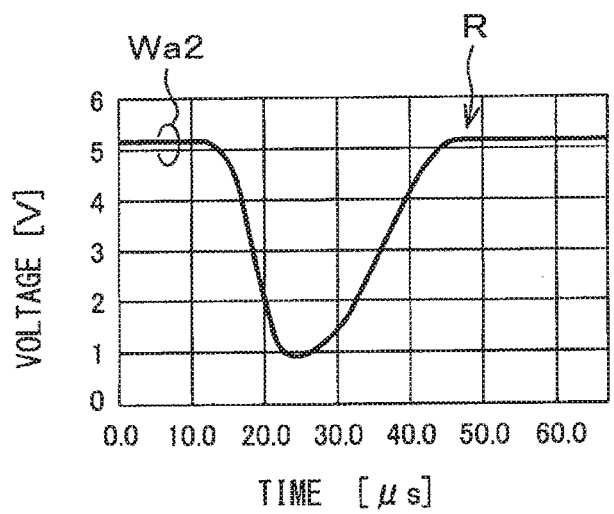
FIG. 11 is a diagram showing an example of an output waveform corresponding to the input of the falling pulse when the ratio of the cutoff frequency of the first filter to the cutoff frequency of the second filter is 1:x (x is greater than 1 and equal to or less than 2.5)
Figure 12:
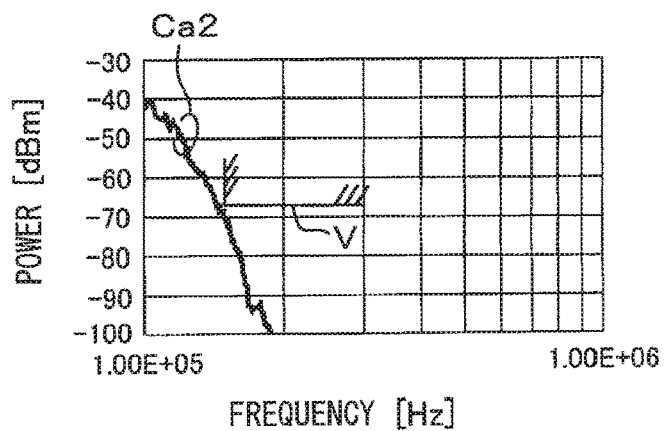
FIG. 12 is a diagram schematically showing a simulation result of a pass characteristic and a simulation result of a cutoff characteristic when the ratio of the cutoff frequency of the first filter to the cutoff frequency of the second filter is 1:x (x is greater than 1 and equal to or less than 2.5)
Figure 13:
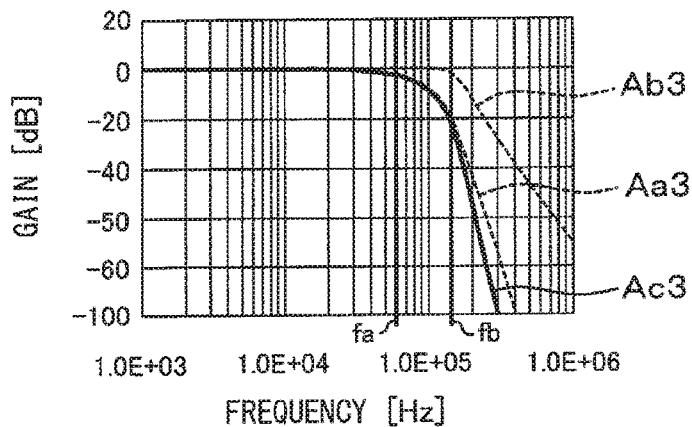
FIG. 13 is a diagram schematically showing a frequency characteristic of gain of each filter when a ratio of the cutoff frequency of the first filter to the cutoff frequency of the second filter is 1:y (y is greater than 2.5)
Figure 14:
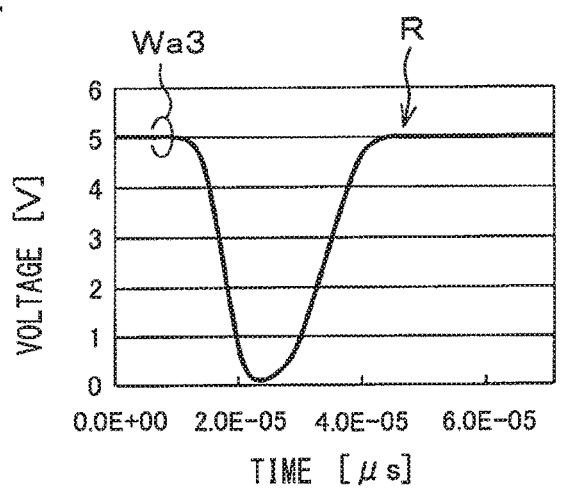
FIG. 14 is a diagram showing an example of an output waveform corresponding to the input of the falling pulse when the ratio of the cutoff frequency of the first filter to the cutoff frequency of the second filter is 1:y (y is greater than 2.5)
Figure 15:
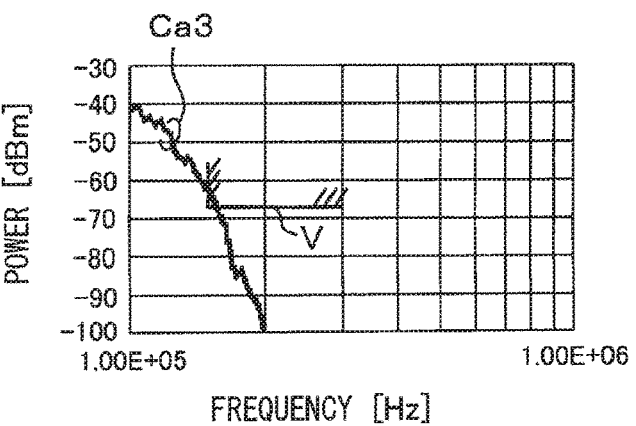
FIG. 15 is a diagram schematically showing a simulation result of a pass characteristic and a simulation result of a cutoff characteristic when the ratio of the cutoff frequency of the first filter to the cutoff frequency of the second filter is 1:y (y is greater than 2.5)

FIG. 7 to FIG. 9 are examples of schematic characteristics when a ratio of the cutoff frequency fa to the cutoff frequency fb is 1:1. FIG. 10 to FIG. 12 schematically show characteristic examples when the ratio of the cutoff frequency fa to the cutoff frequency fb is 1:x (x is greater than 1 and equal to or less than 2.5). FIG. 13 to FIG. 15 schematically show characteristic examples when the ratio of the cutoff frequency fa to the cutoff frequency fb is 1:y (y is greater than 2.5). When the cutoff frequency fa of the Bessel filter 9 is set to 60 [kHz], FIG. 7 to FIG. 15 show characteristic examples in which the cutoff frequency fb of the Chebyshev filter 10 changes. Specifically, FIG. 7 to FIG. 9 show the characteristic examples when fb=60 [kHz], FIG. 10 to FIG. 12 show the characteristic examples when fb=100 [kHz], and FIG. 13 to FIG. 15 show the characteristic examples when fb=151 [kHz] (That is, greater than 150 [kHz]).

In FIG. 7, a frequency characteristic Aa1 represents the characteristic of the Bessel filter 9, a frequency characteristic Ab1 represents the characteristic of the Chebyshev filter 10, and a frequency characteristic Ac1 represents a composite characteristic of the Bessel filter 9 and the Chebyshev filter 10. Assume that, as shown in FIG. 7 to FIG. 9, the ratio of the cutoff frequency fa to the cutoff frequency fb is 1:1. In this case, as shown in FIG. 9, the pass characteristic and the cutoff characteristic Ca1 sufficiently satisfy the standard value V, but, as shown in FIG. 8, ringing R occurs in a rise time of the signal waveform Wa1 related to a single pulse signal. The fluctuation amount of ringing R exceeds a predetermined proportion (for example, 0.5%) of the pulse amplitude. It is concerned that the fluctuation amount caused by ringing R reduces a noise margin.

In FIG. 13, a frequency characteristic Aa3 represents the characteristic of the Bessel filter 9, a frequency characteristic Ab3 represents the characteristic of the Chebyshev filter 10, and a frequency characteristic Ac3 represents a composite characteristic of the Bessel filter 9 and the Chebyshev filter 10. Assume that, as shown in FIG. 13 to FIG. 15, the ratio of the cutoff frequency fa to the cutoff frequency fb is 1:y. In this case, as shown by a signal waveform Wa3 in FIG. 14, the combination of the Bessel filter 9 and the Chebyshev filter 10 is capable of suppressing fluctuation amount of ringing R to a substantially small amount, but, as shown in FIG. 15, the pass characteristic and the cutoff characteristic Ca3 fail to satisfy the standard.

As shown in FIG. 10 to FIG. 12, in the present embodiment, the ratio of the cutoff frequency fa to the cutoff frequency fb is set as 1:x. In FIG. 10, a frequency characteristic Aa2 represents the characteristic of the Bessel filter 9, a frequency characteristic Ab2 represents the characteristic of the Chebyshev filter 10, and a frequency characteristic Ac represents a composite characteristic of the Bessel filter 9 and the Chebyshev filter 10. As shown by a signal waveform Wa1 in FIG. 11, the combination of the Bessel filter 9 and the Chebyshev filter 10 is capable of suppressing fluctuation amount of ringing R to a substantially small amount, and as shown in FIG. 12, the pass characteristic and the cutoff characteristic Cat sufficiently satisfy the standard value V. That is, when a ratio of the cutoff frequency fa of the Bessel filter 9 to the cutoff frequency fb of the Chebyshev filter 10 is set to be greater than 1:1 and equal to or less than 1:2.5, the ringing can be suppressed and the filter characteristic can satisfy the standard.

In the present embodiment, the configuration in which the ratio of the cutoff frequency fa of the Bessel filter 9 to the cutoff frequency fb of the Chebyshev filter 10 is set to be greater than 1:1 and equal to or less than 1:2.5 can provide an improved filter characteristic. The cutoff frequency fa of the Bessel filter 9 or the cutoff frequency fb of the Chebyshev filter 10 is set to be equal to or lower than 150 [kHz]. With this configuration, the standard for the in-vehicle noise can be easily satisfied.

A cutoff frequency of the filter portion 8 may be set to be equal to or lower than four times of an inverse number of minimum pulse interval employed in the communication apparatus 2. The cutoff frequency of the filter portion 8 may be set to be equal to or higher than twice of a frequency calculated based on a slew rate employed in the communication apparatus 2.

As described above, in the signal output unit 6, the rectangular signal passes through the characteristics of the Bessel filter 9 and the Chebyshev filter 10, and then is output from the signal output unit 6. This configuration can process the edge of the signal of the single pulse to be blunt. The cutoff frequency fa of the Bessel filter 9 is set to be lower than the cutoff frequency fb of the Chebyshev filter 10. This configuration can limit the signal to have an intended frequency with the suppressed ringing R that satisfies an intended condition. In the present embodiment, the configuration can satisfy the communication standard in SENT, and the standard in CISPR 25.

(Second Embodiment)

Figure 16:
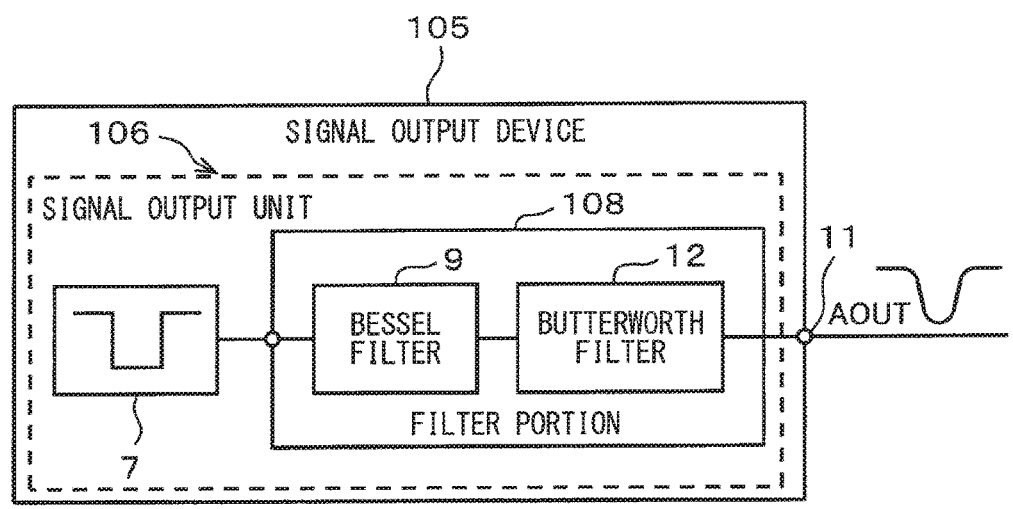
FIG. 16 is a block diagram schematically showing an electrical configuration of a signal output device according to a second embodiment of the present disclosure.
Figure 17:
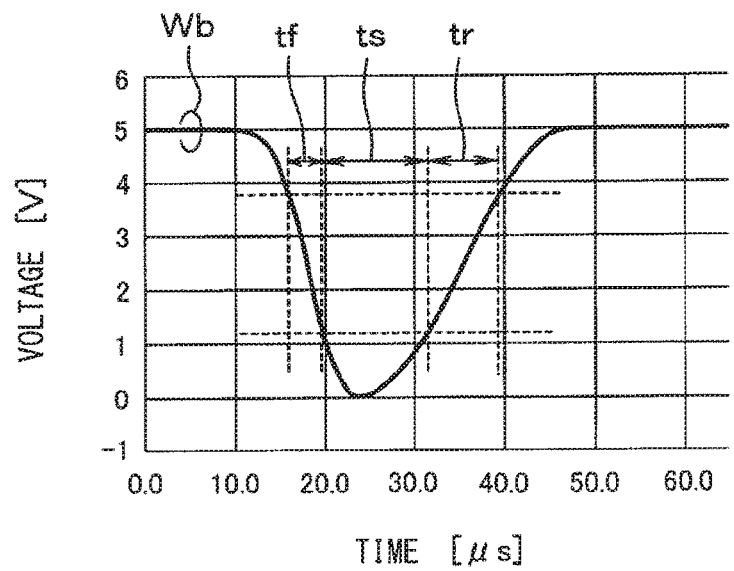
FIG. 17 is a diagram showing an example of an output waveform corresponding to the input of the falling pulse.
Figure 18:
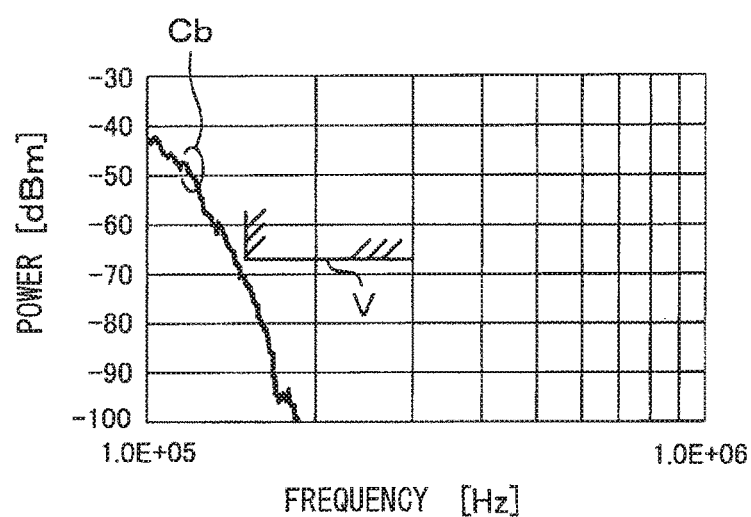
FIG. 18 is a diagram schematically showing a simulation result of a pass characteristic and a cutoff characteristic.

FIG. 16 to FIG. 18 are additional explanation diagrams according to a second embodiment. FIG. 16 shows a configuration instead of FIG. 2. FIG. 17 and FIG. 18 show characteristic diagrams instead of FIG. 5 and FIG. 6, respectively.

As shown in FIG. 16, a signal output device 105 instead of the signal output device 5 includes a signal output unit 106. The signal output unit 106 includes the signal generator 7 and a filter portion 108. The filter portion 108 according to the present embodiment includes the Bessel filter 9 and a Butterworth filter 12. The Bessel filter 9 functions as the first filter and the Butterworth filter 12 functions as the second filter.

The Bessel filter 9 according to the present embodiment has the similar configuration to the Bessel filter 9 according to the first embodiment, thus an explanation of the Bessel filter 9 will be omitted. The Butterworth filter 12 may be provided by a fourth-order Butterworth low-pass filter, and is capable of improving the cutoff characteristic. The Butterworth filter 12 may set a predetermined frequency equal to or lower than 150 [kHz] as a cutoff frequency fc. The Butterworth filter 12 passes the rectangular signal generated by the Bessel filter 9 with a frequency lower than the cutoff frequency fc, and outputs an analog signal AOUT from the output terminal 11. In FIG. 16 of the present embodiment, the Bessel filter 9 is provided in the preceding stage and the Butterworth filter 12 is provided in the following stage. Alternatively, the Bessel filter 9 and the Butterworth filter 12 may be provided in reverse. That is, the Butterworth filter 12 is provided in the preceding stage, and the Bessel filter 9 is provided in the following stage. The filter portion 108 is capable of processing the rectangular signal to be blunt using a combination of the characteristic of the Bessel filter 9 and the characteristic of the Butterworth filter 12. With this configuration, the filter portion 8 is capable of reducing a waveform distortion and suppressing the harmonic.

FIG. 17 corresponds to FIG. 3, and schematically shows a signal waveform W2 when the configuration of the present embodiment is employed. FIG. 18 corresponds to FIG. 4, and schematically shows an output characteristic based on a frequency change when the configuration of the present embodiment is employed. As shown in FIG. 17, a signal waveform Wb satisfies the standard of a falling pulse response by employing the configuration of the present embodiment. FIG. 18 shows a cutoff characteristic Cb, and the configuration of the present embodiment satisfies the standard in CISPR 25 in the frequency band equal to or higher than 150 [kHz]. The cutoff frequency fa is set to be lower than the cutoff frequency fc in a similar manner to the first embodiment. This configuration can limit the signal to have an intended frequency with the suppressed ringing that satisfies an intended condition.

In the present embodiment, in the filter portion 108, the Bessel filter 9 is combined with the Butterworth filter 12. A rectangular signal generated by the signal generator 7 is output through the filter portion 108. The cutoff frequency fa of the Bessel filter 9 is set to be lower than the cutoff frequency fc of the Butterworth filter 12. This configuration can limit the signal to have an intended frequency with the suppressed ringing that satisfies an intended condition. This configuration can also satisfy the standard in CISPR25.

(Third Embodiment)

Figure 19:
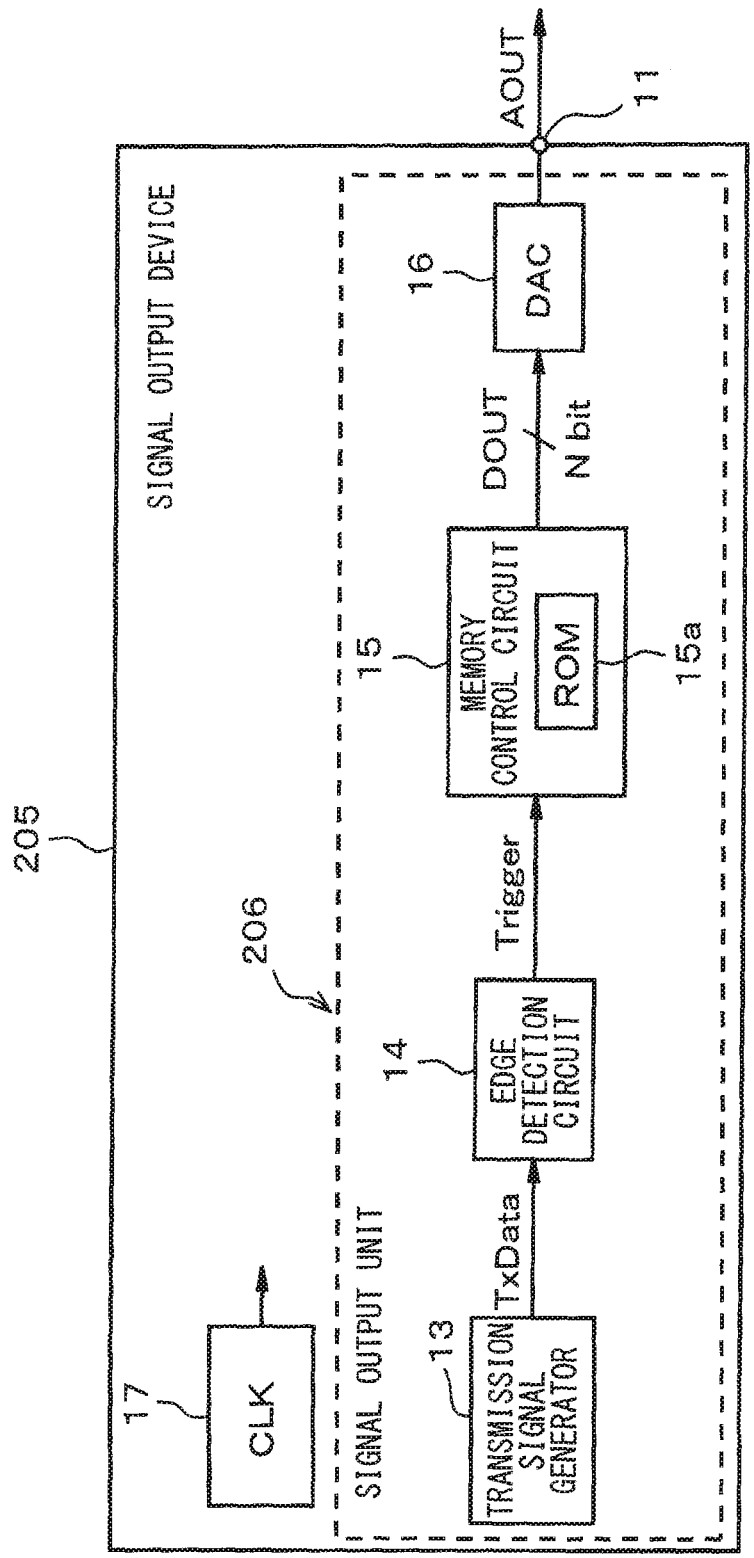
FIG. 19 is a block diagram schematically showing an electrical configuration of a signal output device according to a third embodiment of the present disclosure.
Figure 20:
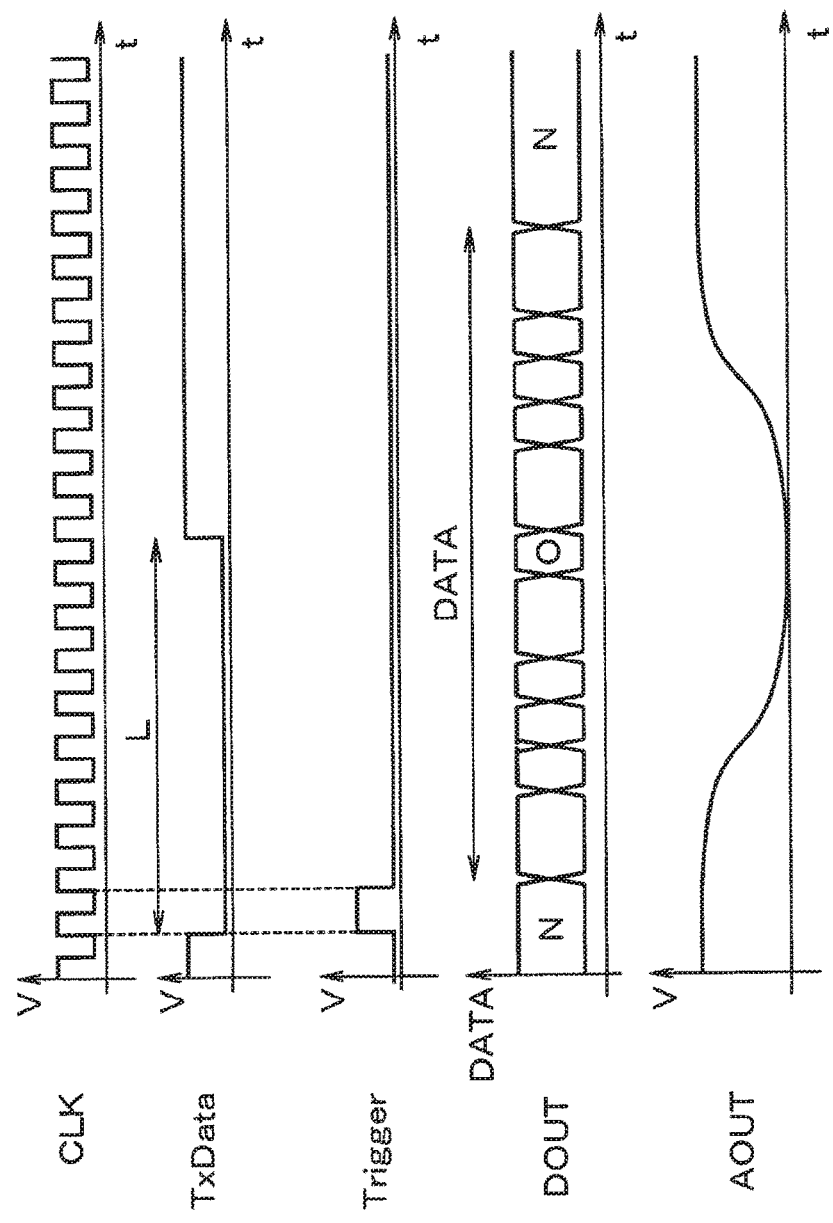
FIG. 20 is a timing diagram schematically showing a signal change of each node.

FIG. 19 and FIG. 20 are additional explanation diagrams according to a third embodiment. The third embodiment does not include the filter portion 8 or the filter portion 108.

FIG. 19 schematically shows a configuration of a signal output device 205. The signal output device 205 includes a signal output unit 206. The signal output unit 206 includes a transmission signal generator 13, an edge detection circuit 14, a memory control circuit 15 and a D/A converter 16. The transmission signal generator 13 generates transmission data TxData, which has two-value levels of H and L, with reference to a clock signal CLK that is generated by a clock generator 17.

The edge detection circuit 14 detects an edge (for example, a falling edge) of the transmission data TxData when receiving the transmission data TxData transmitted from the transmission signal generator 13. The edge detection circuit 14 generates a trigger signal Trigger based on the detected edge, and outputs the trigger signal Trigger to the memory control circuit 15. The memory control circuit 15 includes a memory 15a, such as a ROM which functions as a memory portion. The memory 15a preliminary stores waveform data DATA, as parallel digital data, which corresponds to the transmission data TxData of L level having a predetermined length L. The waveform data DATA represents a digital value that is obtained by executing an analog to digital conversion in N bit (N≥12) to the analog signal AOUT described in the first and second embodiments.

The memory control circuit 15 outputs N-bit parallel data DOUT by synchronizing the waveform data DATA that is stored in the memory 15a with the clock signal CLK. The D/A converter 16 receives the N-bit parallel data DOUT output from the memory control circuit 15. When receiving the N-bit parallel data DOUT, the D/A converter 16 executes a digital to analog conversion to the data and outputs an analog signal AOUT from the output terminal 11.

FIG. 20 schematically shows a timing diagram of signal change of each node. The transmission signal generator 13 outputs the transmission data TxData having the predetermined length L by synchronizing with the clock signal CLK. When detecting an initial edge (for example, the falling edge) of the transmission data TxData, the edge detection circuit 14 outputs the trigger signal Trigger to the memory control circuit 15. When receiving the trigger signal Trigger, the memory control circuit 15 outputs, as the parallel data DOUT, the waveform data DATA, which is preliminary stored in the memory 15a. As described above, the waveform data DATA is a waveform which is obtained by executing the analog to digital conversion operation to the analog signal AOUT output form the output terminal 11 according to the first or the second embodiment. Thus, when executing the digital to analog conversion to the digital data, the D/A converter 16 is capable of outputting the analog signal AOUT having the predetermined length L. This configuration can limit the signal to have an intended frequency with the suppressed ringing that satisfies an intended condition.

According to the present embodiment, the memory control circuit 15 outputs all waveform data DATA in response to one trigger signal Trigger, and the signal output device 205 outputs the analog signal AOUT which is obtained by executing the digital to analog conversion. The configuration described in the present embodiment can provide advantages similar to the above-described embodiments. The memory control circuit 15 can output the analog signal AOUT that corresponds to the waveform data DATA by only receiving the trigger signal Trigger.

One type of the predetermined length L is set for the transmission data TxData in the present embodiment. Alternatively, multiple different lengths may be set for the transmission data TxData. In this case, the memory 15a may store multiple waveform data DATA that correspond to respective predetermined lengths L. In this case, when receiving a trigger signal Trigger, the memory control circuit 15 selects parallel data DOUT from multiple waveform data DATA, which are stored in the memory 15a and have different predetermined lengths L from one another. The memory control circuit 15 outputs the selected parallel data. This configuration can output different analog signals AOUT that correspond to the transmission data TxData having predetermined different lengths L.

(Fourth Embodiment)

Figure 21:
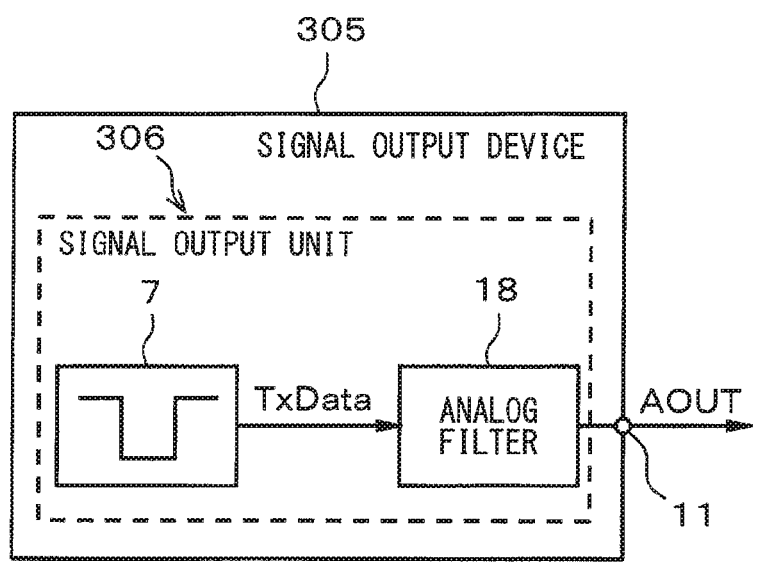
FIG. 21 is a block diagram schematically showing an electrical configuration of a signal output device according to a fourth embodiment of the present disclosure.
Figure 22:
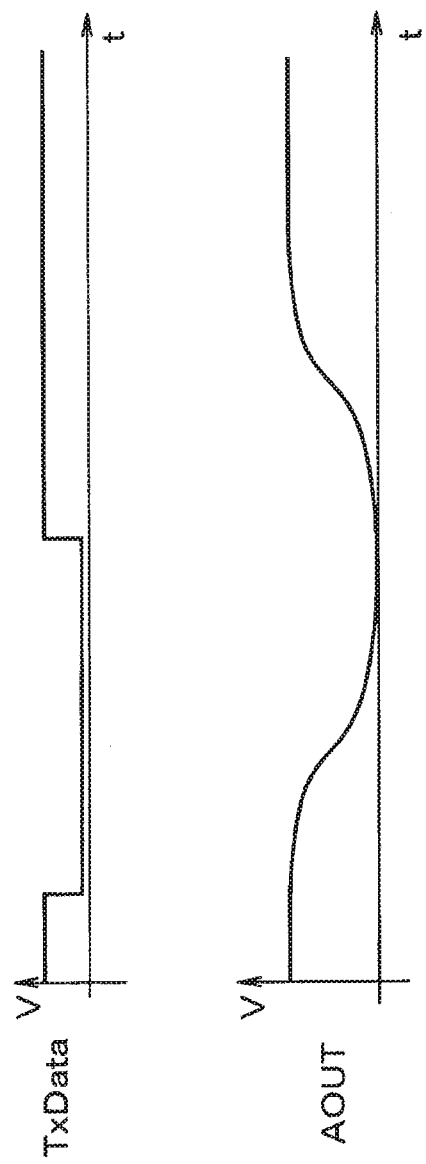
FIG. 22 is a timing diagram schematically showing a signal change of each node.

FIG. 21 and FIG. 22 are additional explanation diagrams according to a fourth embodiment. The fourth embodiment describes an example of a configuration in which an analog filter 18 is employed. FIG. 21 schematically shows the configuration of a signal output device 305. As shown in FIG. 21, the signal output device 305 includes a signal output unit 306, and the signal output unit 306 includes the signal generator 7 and the analog filter 18. The signal generator 7 generates a rectangular communication signal. The analog filter 18 is an analog filter in which the Bessel filter 9 and the Chebyshev filter 10 are connected in cascade. The characteristic of the signal output device 305 of the fourth embodiment is similar to the characteristic of the signal output device 5 of the first embodiment. As shown in a timing diagram of FIG. 22, an analog signal AOUT, which is output from the analog filter 18, represents a signal waveform which is obtained by processing the transmission data TxData to be blunt. Thus, the configuration described in the fourth embodiment can provide advantages similar to the first embodiment. Alternatively, the analog filter 18 may be provided by the Bessel filter 9 and the Butterworth filter 12, which is described in the second embodiment. In this case, the characteristic of the signal output device 305 of the fourth embodiment is similar to the characteristic of the signal output device 105 of the second embodiment, and the configuration described in the fourth embodiment can provide advantages similar to the second embodiment.

(Fifth Embodiment)

Figure 23:
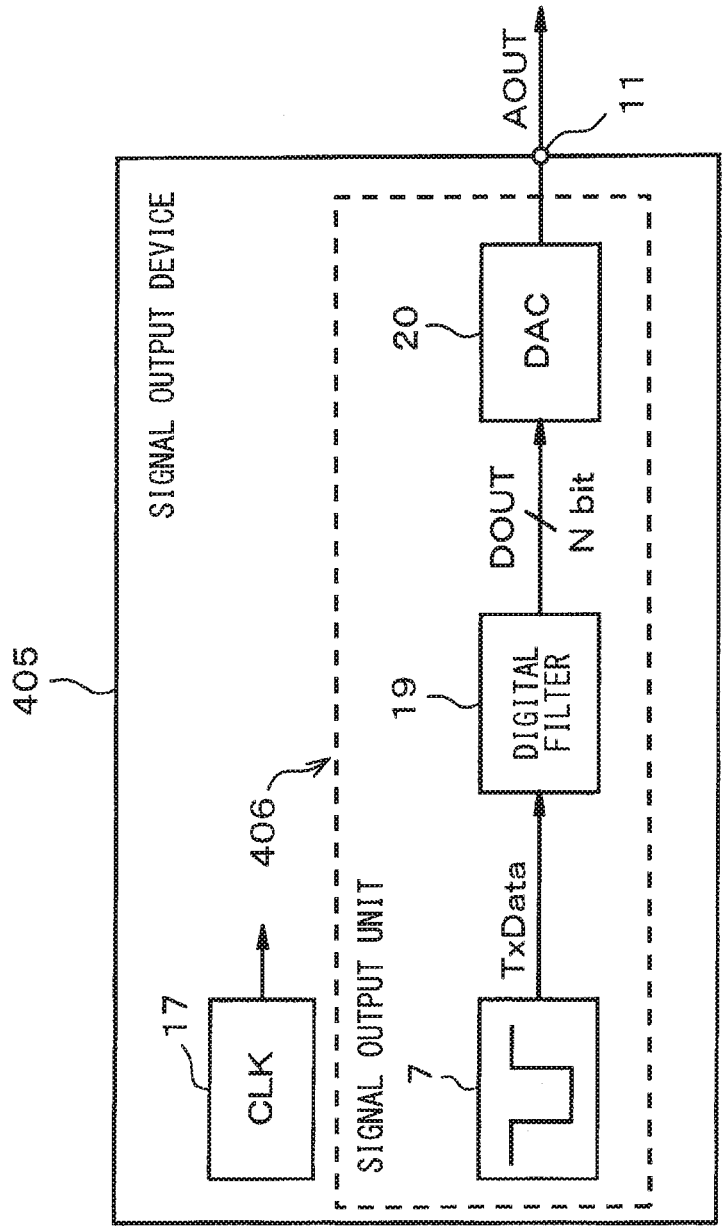
FIG. 23 is a block diagram schematically showing an electrical configuration of a signal output device according to a fifth embodiment of the present disclosure.
Figure 24:
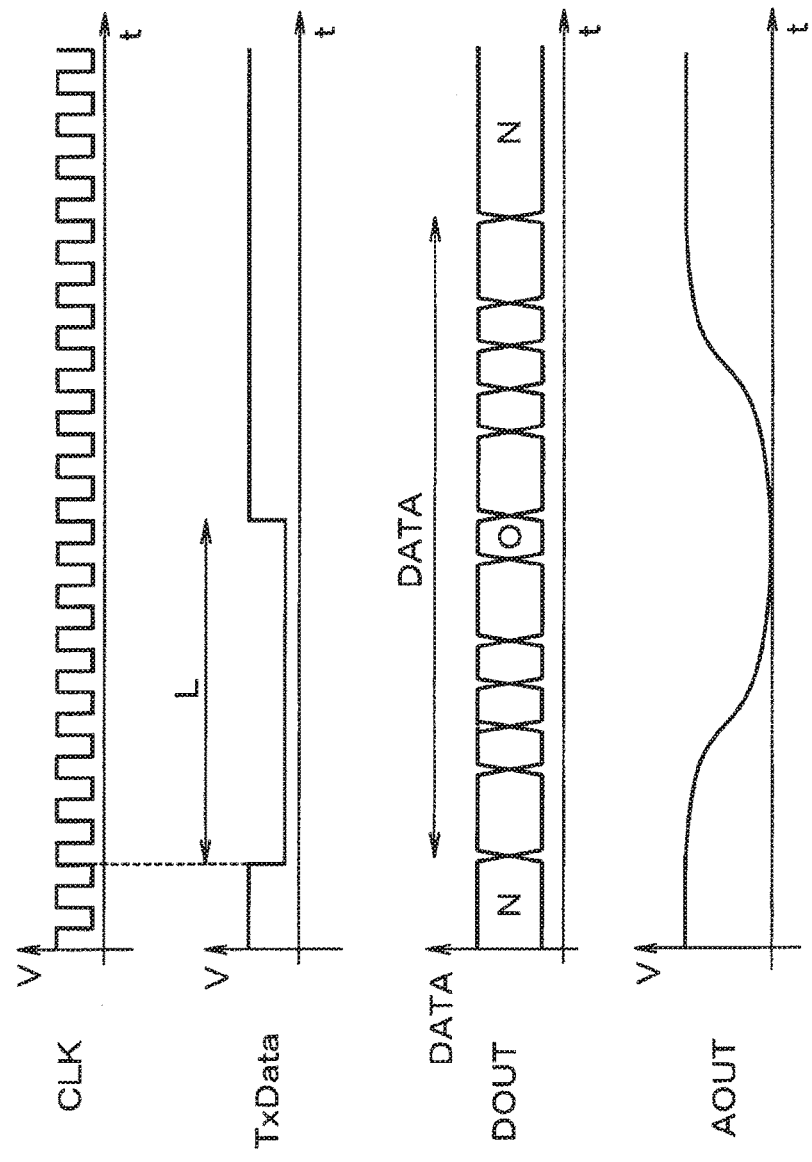
FIG. 24 is a timing diagram schematically showing a signal change of each node.

FIG. 23 and FIG. 24 are additional explanation diagrams according to a fifth embodiment. The fifth embodiment describes an example of a configuration in which a digital filter 19 is employed as the filter portion. FIG. 23 schematically shows the configuration of a signal output device 405. As shown in FIG. 23, the signal output device 405 includes a signal output unit 406. The signal output unit 406 includes the signal generator 7, the digital filter 19, and a D/A converter 20. The signal generator 7 generates the rectangular communication signal. The digital filter 19 is a digital circuit in which the Bessel filter 9 and the Chebyshev filter 10 are connected in cascade. In the present embodiment, the Bessel filter and the Chebyshev filter may be provided by the combination of an IIR filter or an FIR filter. In this case, the characteristic of the signal output device 405 of the fifth embodiment is similar to the characteristic of the signal output device 5 of the first embodiment.

As shown in a timing diagram of FIG. 24, when receiving the transmission data TxData having a predetermined length L, the digital filter 19 outputs parallel data DOUT by executing a digital filter operation to the transmission data TxData. In FIG. 24, the parallel data DOUT is output from the digital filter at a time point of input of the transmission data TxData to the digital filter, but the output of the parallel data is actually delayed by a predetermined clock number due to the operation of the digital filter 19. The D/A converter 20 outputs an analog signal AOUT that corresponds to the parallel data DOUT when receiving the parallel data DOUT. The analog signal AOUT represents a signal waveform which is obtained by processing the transmission data TxData to be blunt. The configuration described in the fifth embodiment can provide advantages similar to the above-described embodiments.

The digital filter 19 may include the Bessel filter 9 and the Butterworth filter 12, which is similar to the second embodiment. In this case, the characteristic of the signal output device 405 of the fifth embodiment is similar to the characteristic of the signal output device 105 of the second embodiment, and the configuration described in the fifth embodiment can provide advantages similar to the second embodiment.

(Sixth Embodiment)

Figure 25:
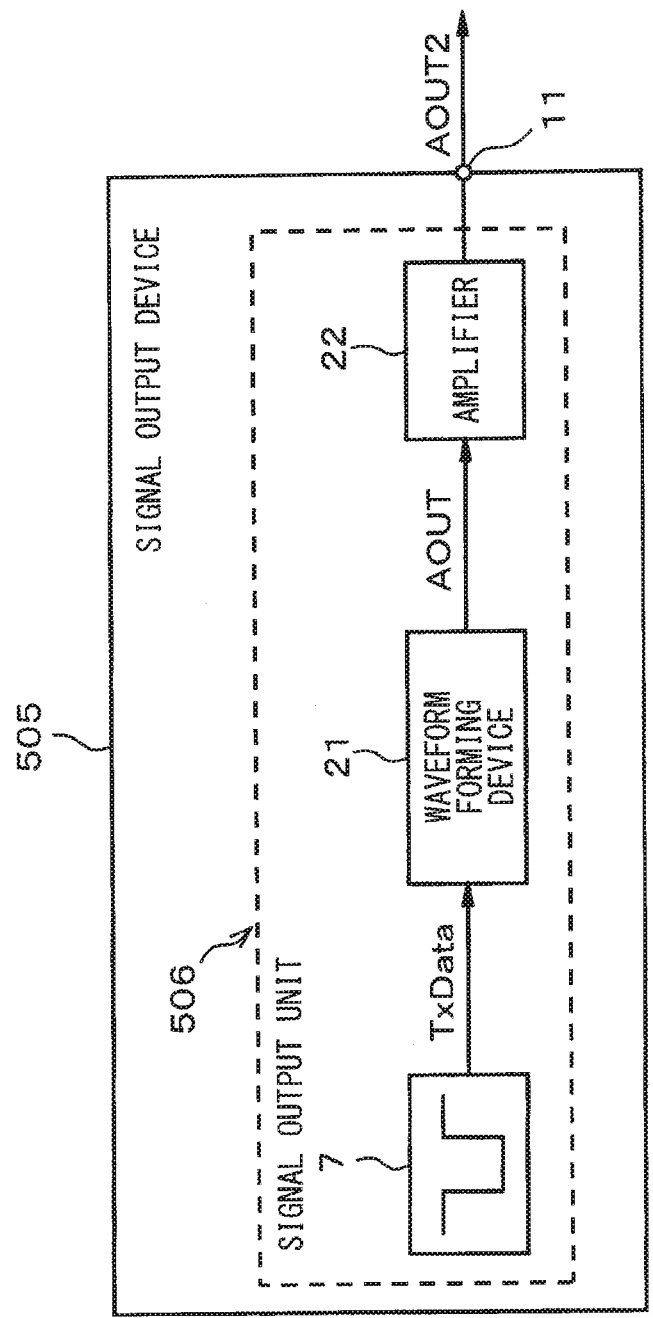
FIG. 25 is a block diagram schematically showing an electrical configuration of a signal output device according to a sixth embodiment of the present disclosure.

FIG. 25 is an additional explanation diagram according to a sixth embodiment. FIG. 25 schematically shows a configuration of a signal output device 505. As shown in FIG. 25, the signal output device 505 includes a signal output unit 506, and the signal output unit 506 includes the signal generator 7, a waveform forming device 21, and an amplifier 22. The waveform forming device 21 is connected to a following stage of the signal generator 7. The filter portion 8 and the filter portion 108 according to the respective first and second embodiments may be employed as the waveform forming device 21. The edge detection circuit 14, the memory control circuit 15, and the D/A converter 16 according to the third embodiment may be employed as the waveform forming device 21. The analog filter 18 according to the fourth embodiment may be employed as the waveform forming device 21. The digital filter 19 and the D/A converter 20 according to the fifth embodiment may be employed as the waveform forming device 21. The amplifier 22 is connected to a following stage of the waveform forming device 21. The amplifier 22 amplifies the analog signal AOUT, and outputs an analog signal AOUT2 from the output terminal 11. The amplifier 22 provided in the signal output unit 506 is capable of amplifying the analog signal AOUT and outputting the signal.

In the figures, the reference symbol 4 represents the single line. Each of the reference symbols 5, 105, 205, 305, 405, 505 represents the signal output device. Each of the reference symbols 6, 106, 206, 306, 406, 506 represents the signal output unit. The reference symbol 9 represents the Bessel filter that corresponds to the first filter. The reference symbol 10 represents the Chebyshev filter that corresponds to the second filter. The reference symbol 12 represents the Butterworth filter that corresponds to the second filter. The reference symbol 15a represents the memory that functions as the memory portion. In addition, the reference symbol fa represents the cutoff frequency of the Bessel filter. The reference symbol fb represents the cutoff frequency of the Chebyshev filter. The reference symbol fc represents the cutoff frequency of the Butterworth filter.

(Other Embodiments)

The present disclosure should not be limited to the above embodiments and the embodiment may be modified or broadened as described below.

The above embodiments may be implemented in combinations. The embodiments described above may employ, but are not limited to, the in-vehicle communication standard in SENT. Alternatively, a standard for LIN (Local Interconnection Network) may be employed. In the above-described embodiments, the rectangular signal is described as an example which has the harmonic. The signal employed in the present disclosure may employ, but are not limited to, the rectangular signal. Alternatively, a pulse signal may be employed as the communication signal. Alternatively, a predetermined signal that has an arbitrary waveform may be employed. The embodiments described above may be employed in an in-vehicle apparatus, but the configurations may also be employed in other devices except a vehicle device.

While the disclosure has been described with reference to preferred embodiments thereof, it is to be understood that the disclosure is not limited to the preferred embodiments and constructions. The disclosure is intended to cover various modification and equivalent arrangements. In addition, the various combinations and configurations, which are preferred, other combinations and configurations, including more, less or only a single element, are also within the spirit and scope of the disclosure.

The invention claimed is:

1. A signal output device that is provided in a communication apparatus, and the communication apparatus communicating with a different one of the communication apparatus using a single line,
the signal output device comprising
a signal output unit including a first filter and a second filter, wherein the first filter is provided by a Bessel filter, the second filter is provided by a Chebyshev filter or a Butterworth filter, the signal output unit outputs a signal which is obtained by passing a predetermined signal through the first filter and the second filter, the signal output from the signal output unit has a pass characteristic of the first filter and a pass characteristic of the second filter,
wherein
a cutoff frequency of the first filter is set to be lower than a cutoff frequency of the second filter.
2. The signal output device according to claim 1, wherein a ratio of the cutoff frequency of the first filter to the cutoff frequency of the second filter is set to be greater than 1:1 and equal to or less than 1:2.5.

3. The signal output device according to claim 1, wherein the cutoff frequency of the first filter or the cutoff frequency of the second filter is set to be equal to or lower than 150 [kHz].

4. The signal output device according to claim 1 further comprising
a memory portion configured to preliminary store waveform data that is digital data, wherein the waveform data is obtained by passing the predetermined signal through the pass characteristic of the first filter and the pass characteristic of the second filter, and
wherein
the signal output unit executes, in response to an input trigger signal, a digital to analog conversion to the digital data of the waveform data that is stored in the memory portion, and outputs an analog signal that is converted from the waveform data.

* * * * *